(12) United States Patent
Yamashita

(10) Patent No.: US 6,313,844 B1
(45) Date of Patent: Nov. 6, 2001

(54) STORAGE DEVICE, IMAGE PROCESSING APPARATUS AND METHOD OF THE SAME, AND REFRESH CONTROLLER AND METHOD OF THE SAME

(75) Inventor: Yujiro Yamashita, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/253,018

(22) Filed: Feb. 19, 1999

(30) Foreign Application Priority Data

Feb. 24, 1998 (JP) .................................................. 10-042437
Jan. 18, 1999 (JP) .................................................. 11-009754

(51) Int. Cl.[7] ...................................................... G09G 5/39
(52) U.S. Cl. ............................ 345/531; 365/222; 711/106
(58) Field of Search ..................................... 345/531, 545, 345/419, 582, 552; 365/222; 711/106, 105

(56) References Cited

U.S. PATENT DOCUMENTS

| | | | |
|---|---|---|---|
| 4,984,209 | * 1/1991 | Rajaram et al. ...................... | 365/222 |
| 5,241,642 | * 8/1993 | Norsworthy et al. ................. | 395/508 |
| 5,418,920 | * 5/1995 | Kuddes ................................ | 711/106 |
| 5,682,498 | * 10/1997 | Harness ............................... | 711/106 |
| 5,933,381 | * 8/1999 | Iwata ................................... | 365/222 |
| 6,188,627 | * 2/2001 | Blackmon et al. ................... | 365/222 |

* cited by examiner

Primary Examiner—Kee M. Tung
(74) Attorney, Agent, or Firm—Ronald P. Kananen; Rader, Fishman & Grauer

(57) ABSTRACT

A storage device which can perform a refresh on a semiconductor memory with a small sized configuration, including a timing generation circuit of a DRAM which requires a refresh for retaining the memory, a memory access circuit for accessing a line buffer memory, a refresh control circuit for control so that an indicated number of refreshes of the line buffer memory is performed within a predetermined interval, and a CPU for monitoring the accessing load to the line buffer memory by the memory access circuit, determining the number of refreshes within the predetermined interval based on the load, and instructing the determined number to the refresh control circuit.

22 Claims, 9 Drawing Sheets

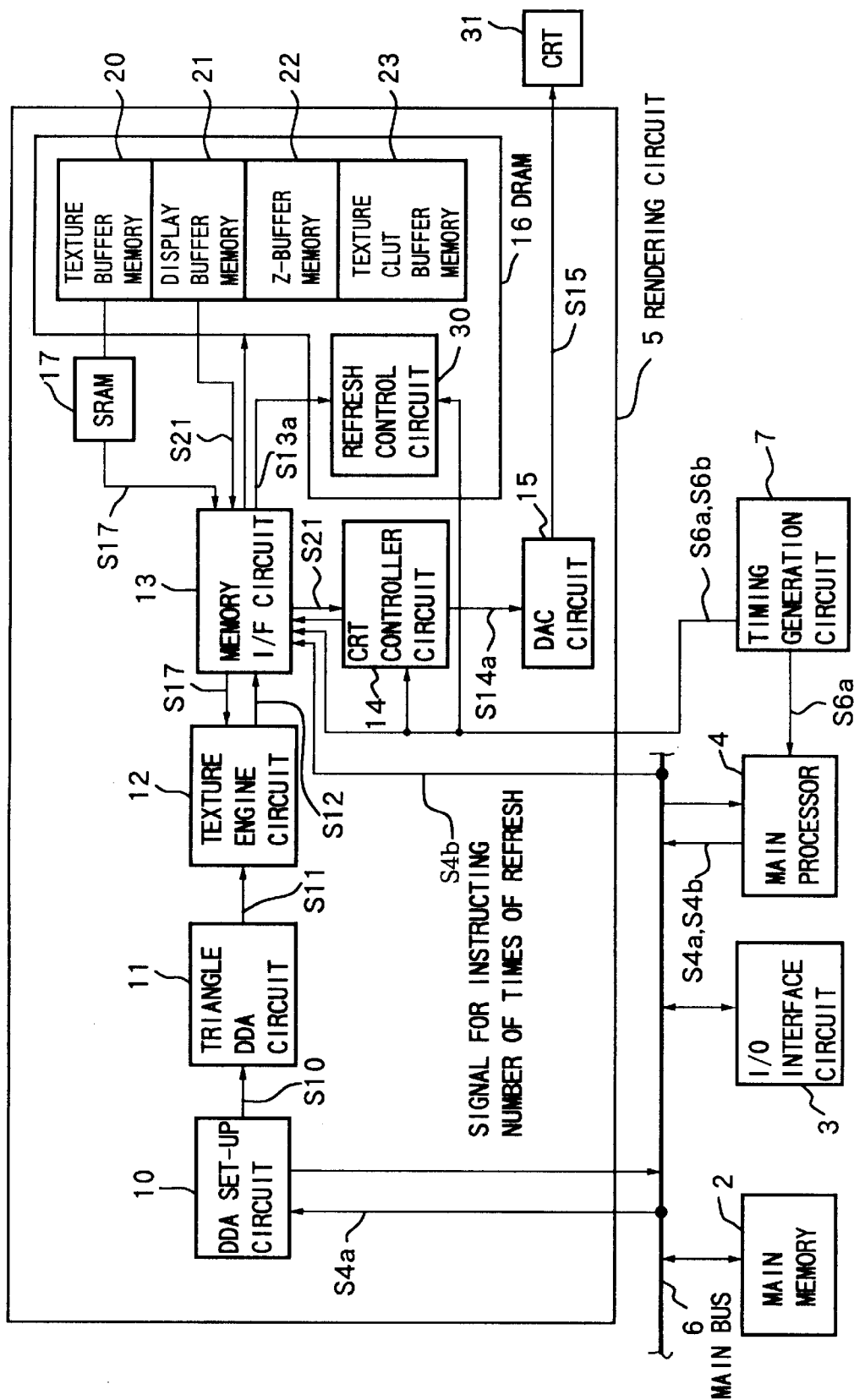

STORAGE DEVICE, IMAGE PROCESSING APPARATUS AND METHOD OF THE SAME, AND REFRESH CONTROLLER AND METHOD OF THE SAME

BACKGROUND OF THE INVENTION

1. Field of the Invention

The present invention relates to a storage device provided with a dynamic random access memory (DRAM) or other semiconductor memory which requires a refresh for memory retention, an image processing apparatus and method of the same, and a refresh controller for controlling the refresh of the semiconductor memory and a method of the same.

2. Description of the Related Art

Computer graphics are often used in a variety of computer aided design (CAD) systems and in amusement machines. Especially, along with the recent advances in image processing techniques, systems using three-dimensional computer graphics are rapidly spreading.

In three-dimensional computer graphics, the color value of each pixel is calculated at the time of deciding the color of each corresponding pixel. Then, rendering is performed for writing the calculated value to an address of a display buffer (frame buffer memory) corresponding to the pixel.

One of the rendering methods is polygon rendering. In this method, a three-dimensional model is expressed as a composite of triangular unit graphics (polygons). By drawing using the polygons as units, the colors of the pixels of the display screen are decided.

In the above system, an image signal (data) obtained by the graphic processing is written (drawn) in an image memory. Then the image signal is read and output on a display such as a cathode ray tube (CRT).

As the image memory, semiconductor memories, such as a DRAM, are generally used.

A DRAM is configured by using a plurality of memory cells for storing data by accumulating charges in capacitors. The charges accumulated in the capacitors in such memory cells are lost along with time, so it is necessary to regularly refresh (recharge) the capacitors in the memory cells in order to maintain the stored data.

Note that writing and reading of data are prohibited during a refresh.

Accordingly, when using a DRAM as an image memory, in order to prevent deterioration of the picture quality of the image on the display by a refresh operation, a predetermined number of refreshes are performed during a horizontal blanking interval and vertical blanking interval of the image signal.

Also, in such an image memory, the image signal is drawn (written) during a time when a refresh is not being performed in the horizontal blanking interval and the vertical blanking interval when displaying the image on the display. The image signal read from the image memory is output to the display during display intervals.

In this case, because a refresh is essential for maintaining the storage of the image signal in the image memory, a refresh is given priority over a write operation of an image signal within the horizontal blanking interval and the vertical blanking interval.

Turning now to the problem to be solved by the present invention, the load of writing an image signal to an image memory varies in accordance with the resolution of the image corresponding to the image signal and the contents of the image signal.

Accordingly, if a refresh of the image memory is performed at fixed time intervals as in the related art, both the refresh and the write operation of the image signal to the image memory cannot be carried out within a blanking interval. As explained above, the refresh is given priority. Therefore, there is a possibility that a part of the image signal will not be able to be written in the image memory. In this way, there is a problem of deterioration of the displayed image when the necessary image signal cannot be written in the image memory.

Also, if a refresh of the image memory is performed at fixed time intervals as in the related art, the load of the semiconductor memory becomes heaviest when the load of writing is the heaviest, so that the peak of the power consumption becomes high along with that. Here, it is necessary to use interconnections, circuit elements, etc. in the semiconductor memory which have large capacities commensurate with the peak of the power consumption. Therefore, there is the problem that the semiconductor memory becomes large in size.

SUMMARY OF THE INVENTION

An object of the present invention is to provide a storage device which can improve the performance in accessing a semiconductor memory while suitably retaining stored data of the semiconductor memory by a refresh, an image processing apparatus and a method of the same, and a refresh controller and method of the same.

Another object of the present invention is provide a storage device, an image processing apparatus, and a refresh controller which lightens the load of the semiconductor memory along with a refresh and helps reduce the size of the semiconductor memory.

To attain the above objects, according to a first aspect of the present invention, there is provided a storage device comprising at least one semiconductor memory which requires a refresh to retain memory; a memory access circuit for accessing the semiconductor memory; a refresh operation control circuit for controlling the semiconductor memory so that an instructed number of refreshes are performed in a predetermined period; and a refresh number determining circuit for monitoring the load of the access of the memory access circuit with respect to the semiconductor memory, determining the number of refreshes performed in the predetermined period on the basis of the load, and instructing the determined number of refreshes to the control circuit.

Preferably, the semiconductor memory stores an image signal; the memory access circuit writes the image signal to the semiconductor memory in a blanking interval at the time of displaying an image according to the image signal read from the semiconductor; and the refresh number determining circuit monitors the load of writing of the image signal by the memory access circuit.

Preferably, the memory access circuit reads the image signal from the semiconductor outside the blanking interval.

Preferably, the refresh number determining circuit determines the number of refreshes to be performed in the predetermined period to be smaller along with an increase of the access load.

Alternatively, the refresh number determining circuit executes a predetermined program, controls the memory access circuit on the basis of the result of the execution of the program, and determines the access load on the basis of the program.

More preferably, the at least one semiconductor memory comprises at least a first semiconductor memory and a second semiconductor memory capable of being accessed at the same time and the memory access circuit writes an image signal in the first semiconductor memory in a first blanking interval and a first display interval for reading image data from the second semiconductor memory following the first blanking interval and writes an image signal to the second semiconductor memory in a second blanking interval and a second display interval for reading image data from the first semiconductor memory following the second blanking interval.

More preferably, the semiconductor memory is a line buffer memory, a frame buffer memory, or a dynamic random access memory (DRAM).

More preferably, the blanking interval is a horizontal blanking interval.

According to a second aspect of the invention, there is provided a refresh controller for controlling a refresh of a semiconductor memory which requires a refresh to retain memory, comprising a refresh control circuit for control so that the semiconductor memory a performs an instructed number of refreshes in a predetermined period and a refresh number determining circuit for monitoring the load of the access with respect to the semiconductor memory, determining the number of refreshes to be performed in the predetermined period on the basis of the load, and instructing the determined number to the refresh control circuit.

Preferably, when an image signal is stored in the semiconductor memory and image data is written in the semiconductor memory in a blanking interval at the time of displaying an image in accordance with the image signal read from the semiconductor memory, the refresh number determining circuit monitors the load of writing of the image signal with respect to the semiconductor memory.

According to a third aspect of the present invention, there is provided an image processing apparatus comprising an image processing circuit performing image processing to produce image data; a semiconductor memory storing the image data and requiring a refresh to retain the memory; a memory access circuit for writing the produced image data in a blanking interval at the time of displaying an image in accordance with image data read from the semiconductor memory; a refresh control circuit for control so that the semiconductor memory performs the instructed number of refreshes in a predetermined period; a refresh number determining circuit for monitoring the load of the access of the memory access circuit with respect to the semiconductor memory, determining the number of refreshes performed in the predetermined period on the basis of the load, and instructing the determined number to the refresh control circuit.

Preferably, the memory access circuit reads image data from the semiconductor memory and outputs the same to display means outside of the blanking interval.

Preferably, the refresh number determining circuit executes a predetermined program and controls the memory access circuit and the image processing circuit on the basis of the result of the execution.

Preferably, when a three-dimensional model is expressed by a composite of unit graphics to which common processing conditions are applied, texture data indicating a pattern to be displayed in the unit graphics is set in correspondence with the unit graphics, and an image in accordance with the correspondence is displayed, the semiconductor memory stores the texture data and the image data, the memory access circuit outputs the texture data read from the semiconductor memory to the image processing circuit, and the image processing circuit generates the image data by the correspondence between the unit graphics and the texture data.

Preferably, the semiconductor memory stores a plurality of texture data corresponding to different reducing rates.

Preferably, the apparatus further comprises a unit graphic rendering data generating means for generating unit graphic rendering data including three-dimensional coordinates (x, y, z), R (red), G (green), B (blue) data, homogeneous coordinates (s, t), and a homogeneous term q for vertexes of the unit graphics and an interpolation data generating means for interpolating unit graphic rendering data to generate image data of pixels located inside the unit graphics, and the memory access circuit reads texture data corresponding to a desired reducing rate from the address of the semiconductor memory specified by homogeneous coordinates (s, t) and a homogeneous term q included in the image data and the image processing circuit produces the image data on the basis of the produced image data and the read texture data.

According to a fourth aspect of the present invention, there is provided a refresh control method for controlling a refresh of a semiconductor memory which requires a refresh to retain memory, comprising monitoring a load of access to the semiconductor memory and determining a number of refreshes to be performed in a predetermined period on the basis of the load and controlling so that the semiconductor memory performs the determined number of refreshes in the predetermined period.

Preferably, when an image signal is stored in the semiconductor memory and image data is written in the semiconductor memory in a blanking interval at the time of displaying an image in accordance with the image signal read from the semiconductor memory, it monitors the load of writing of the image signal with respect to the semiconductor memory and determines the number of refreshes to be performed in the predetermined period on the basis of the load.

According to a fifth aspect of the present invention, there is provided an image processing method comprising performing image processing to produce an image signal; writing the produced image signal in the semiconductor memory in a blanking interval at the time of displaying an image in accordance with an image signal read from a semiconductor memory which requires a refresh to retain memory; monitoring the load of writing of the image signal with respect to the semiconductor memory and performing the number of refreshes to be performed in the predetermined period on the basis of the load; and controlling so that the semiconductor memory performs the determined number of refreshes in the predetermined period.

Preferably, the method further comprises reading the image signal from the semiconductor memory and outputting it to display means outside the blanking interval.

BRIEF DESCRIPTION OF THE DRAWINGS

These and other objects and features of the present invention will become clearer from the following description of the preferred embodiments given with reference to the accompanying drawings, in which:

FIG. 9 is a view of the configuration of a three-dimensional computer graphic system of a fourth embodiment of the present invention.

DESCRIPTION OF THE PREFERRED EMBODIMENTS

Below, an image memory system and a three-dimensional computer graphic system according to embodiments of the present invention will be explained.

First Embodiment

Figure 1:
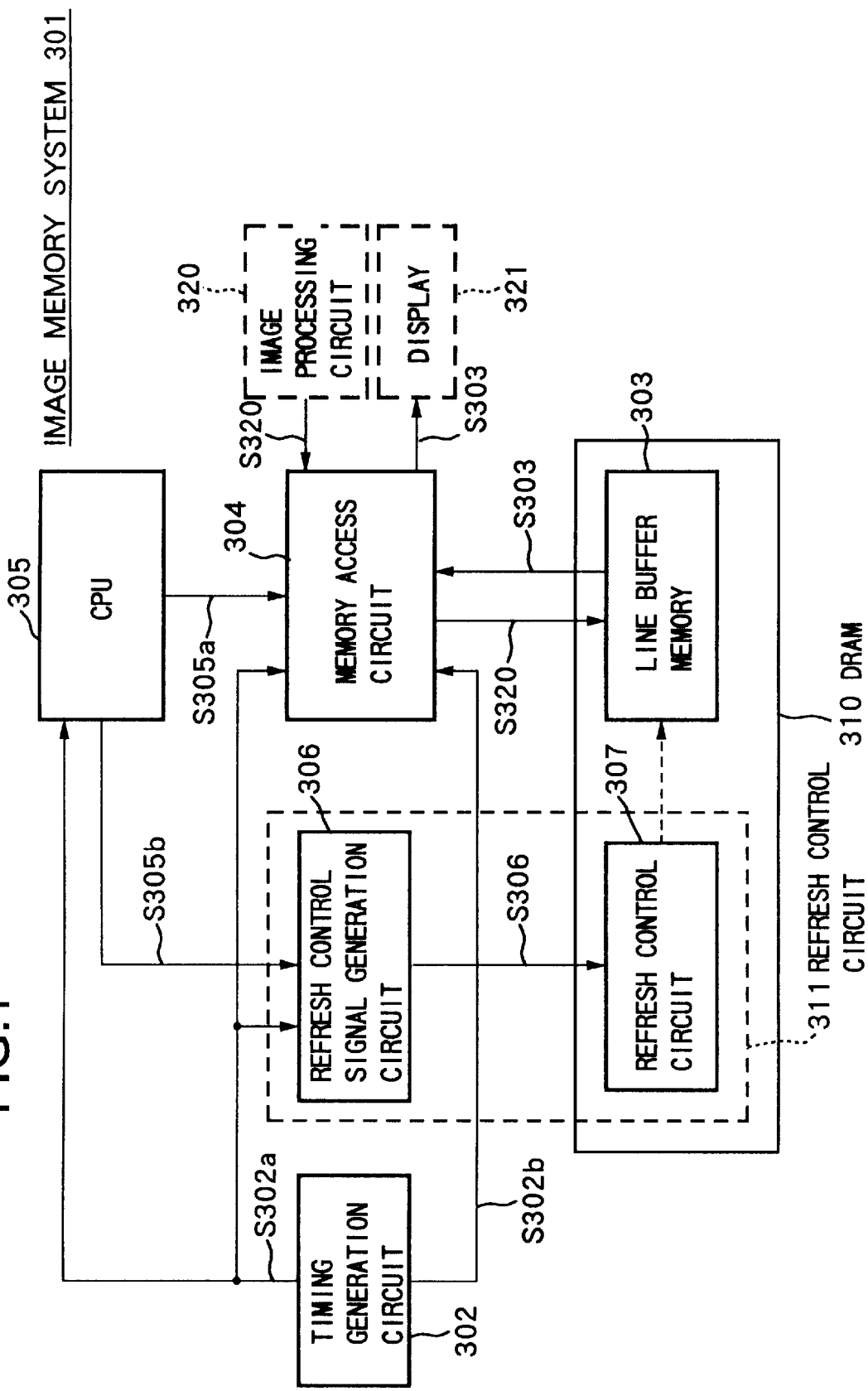
FIG. 1 is a view of the configuration of an image memory system according to a first embodiment of the present invention.

FIG. 1 is a view of the configuration of an image memory system 301 according to a first embodiment of the present invention.

As shown in FIG. 1, the image memory system 301 comprises a timing generation circuit 302, a line buffer memory 303, a memory access circuit 304, a CPU 305, a refresh control signal generation circuit 306, and a refresh control circuit 307.

Here, the refresh control circuit 311 of the present invention is constituted by the refresh control signal generation circuit 306 and the refresh control circuit 307. The refresh control circuit 307 and the line buffer memory 303 are integrated in the DRAM corresponding to the semiconductor memory of the present invention.

The memory access circuit 304 corresponds to the memory access circuit of the present invention, and the CPU 305 corresponds to a circuit for determining the number of refreshes.

In the image memory system 301 shown in FIG. 1, an image signal S320 output from an image processing circuit 320 is written (drawn) in the line buffer memory 303 in the DRAM 310 via the memory access circuit 304, then is output as an image signal S303 via the memory access circuit 304 to a display 321 such as a CRT.

The refresh of the line buffer memory 303 is performed by the refresh control circuit 307 based on the refresh control signal S306 from the refresh control signal generation circuit 306. At this time, based on the load of writing the image signal S320 to the line buffer memory 303 by the memory access circuit 304, the number of refreshes performed within a horizontal blanking interval is determined in the line buffer memory 303.

Below, the components will be explained in detail.

[Timing Generation Circuit 302]

The timing generation circuit 302 generates a horizontal synchronizing signal S302a having a predetermined frequency and outputs the generated horizontal synchronizing signal S302a to the memory access circuit 304, the CPU 305, the refresh control signal generation circuit 304, and the memory access circuit 307.

Also, the timing generation circuit 302 generates a vertical synchronizing signal S302b having a predetermined frequency and outputs the generated vertical synchronizing signal S302b to the memory access circuit 307.

[Line Buffer Memory 303]

The line buffer memory 303 is, for example, a line buffer memory of a single buffer system and stores one line's worth of image signal in one screen's worth of image signal to be displayed on the display 321.

Also, the line buffer memory 303 is subjected to a refresh by the refresh control circuit 307 in order to retain the stored data.

The refresh is, as will be explained later, performed during the horizontal blanking interval and the vertical blanking interval of an image display on the display 321 to prevent a break in the image display on the display 321.

[Memory Access Circuit 304]

The memory access circuit 304, based on a control signal S305a from the CPU 305, writes the image signal S320 input from the image processing circuit 320 to the line buffer memory 303 of the DRAM 310 in units of one line's worth of the image signal at timings based on the horizontal synchronizing signal S302a and the vertical synchronizing signal S302b from the timing generation circuit 302 and outputs the image signal S303 read from the line buffer memory 303 to the display 321.

Here, in the first embodiment, since the line buffer memory 303 is a single buffer system, the writing interval (drawing interval) of the image signal S320 to the line buffer memory 303 by the memory access circuit 304 is within the horizontal blanking interval and the vertical blanking interval of the image display on the display 321.

Accordingly, within the horizontal blanking interval and the vertical blanking interval of the image display, both the writing of the image signal S320 and refresh are performed to the line buffer memory 303. Therefore, in the first embodiment, as will be explained later, the number of refreshes performed during the horizontal blanking interval is variably controlled based on the load of writing of the image signal S320.

Also, the reading interval (display interval) of the image signal S303 from the line buffer memory 303 by the memory access circuit 304 is outside the horizontal blanking interval and the vertical blanking interval of the image display on the display 321.

[CPU 305]

The CPU 305 executes, for example, a predetermined program and outputs a control signal S305a in accordance with the execution of the program to the memory access circuit 304.

Also, the CPU 305 monitors, based on the program contents, the load state of the writing to the line buffer memory 303 of the DRAM 310 by the memory access circuit 304, determines the number of refreshes to perform within the horizontal blanking interval, and outputs a refresh number instruction signal S305b to the refresh control signal generation circuit 306.

Below, the processing for generating a refresh number instruction signal S305b in the CPU 305 will be explained.

Figure 2:
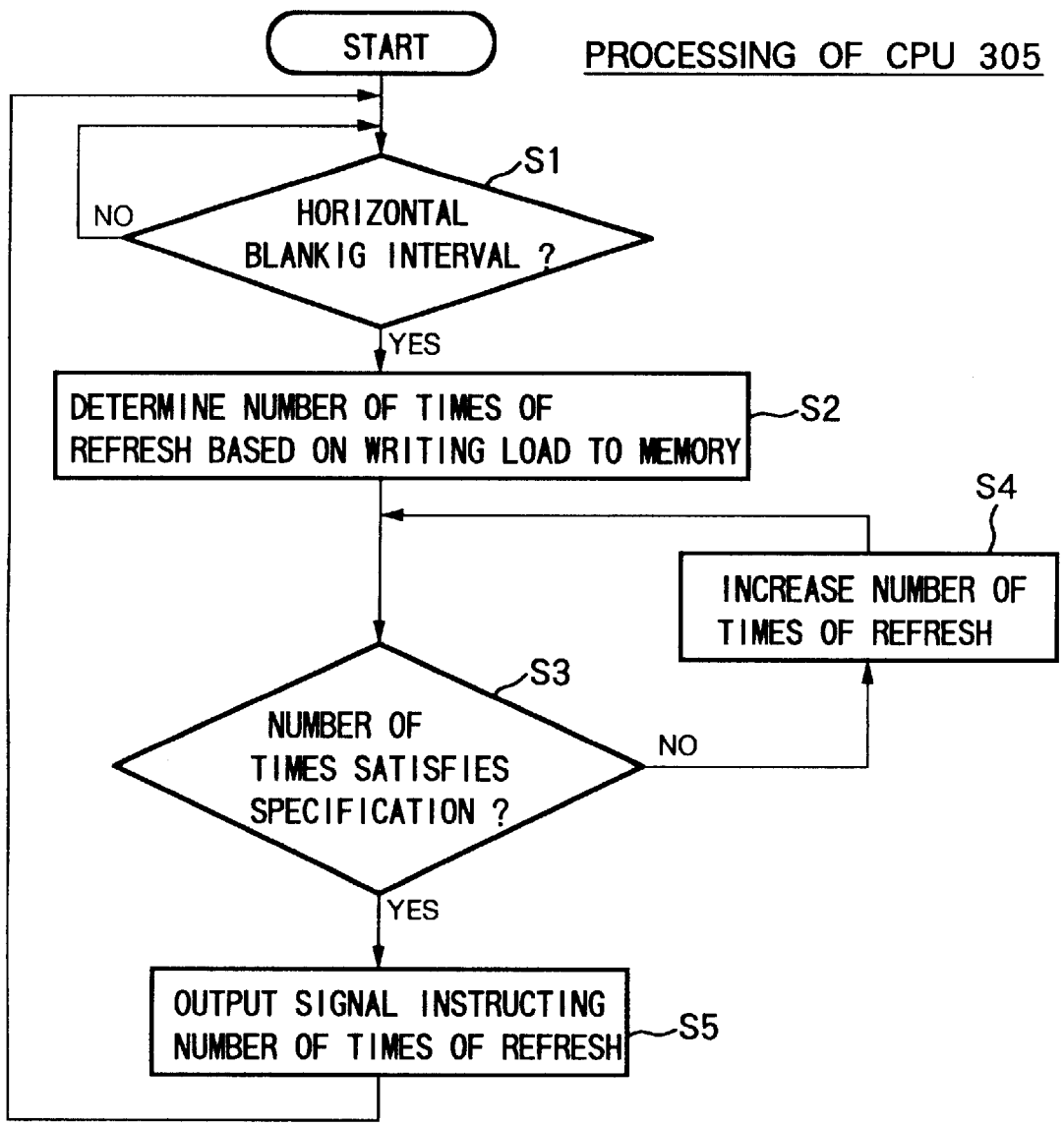
FIG. 2 is a flow chart of processing for generating a refresh number instruction signal in a central processing unit (CPU) shown in FIG. 1.

FIG. 2 is a flow chart of the processing for generating the refresh number instruction signal S305b in the CPU 305.

Step 1: The CPU 305 determines, based on the horizontal synchronizing signal S302a (or horizontal blanking signal), whether or not the image display on the display 321 is in the horizontal blanking interval of the image signal S306. When it is determined to be in the horizontal blanking interval, the CPU 305 executes the processing of step S2, and if not, repeats the processing of step S1.

Step 2: The CPU 305 judges, based on the content executed by the program, the state of the writing load to the line buffer memory 303 of the DRAM 310 by the memory access circuit 304. Then, based on the result of the judgement, the CPU 305 determines the number of refreshes within the horizontal blanking interval to the line buffer memory 303 so as to disperse the load of the line buffer memory 303.

Specifically, the CPU 305 sets the number of refreshes performed within the horizontal blanking interval lower along with the increase of the writing load to the line buffer memory 303 by the memory access circuit 304 (increase of number of times of writing).

Step 3: The CPU 305 judges whether or not the number of refreshes determined at step 2 satisfies a predetermined specification. If CPU 305 judges that it does not satisfy the specification, the CPU 305 executes the processing of step S4; however, if CUP 305 judges that, it does, then CPU 305 executes the processing of step S5.

Specifically, when it is determined by the specification to perform the refresh at least n number of times within the time T, the CPU 305 judges whether or not the number of refreshes determined at step S2 is below the standard set by the specification.

Step S4: This step is performed when the number of refreshes is judged not to satisfy the specification at step S3. The CPU 305 newly determines a number of refreshes by increasing the number determined at step S2 and executes the processing of step S3 again.

Step S5: This step is carried out when it is judged that the number of refreshes satisfies the specification at step S3. The CPU 305 outputs the refresh number instruction signal S305$b$ indicating the determined number of refreshes to the refresh control signal generation circuit 306. The CPU 305 then executes the processing of step S1 again.

[Refresh Control Signal Generation Circuit 306]

The refresh control signal generation circuit 306 outputs to the refresh control circuit 307 a refresh control signal S306 for controlling the number of refreshes indicated by the refresh number instruction signal S305$b$ from the CPU 305 within the horizontal blanking interval determined based on the horizontal synchronizing signal S302$a$.

[Refresh Control Circuit 307]

The refresh control circuit 307 performs a refresh of the line buffer memory 303 based on the refresh control signal S306 from the refresh control signal generation circuit 306.

Below, the operation of the image memory system 301 shown in FIG. 1 will be explained.

First, the line buffer memory 303 is accessed by the memory access circuit 304 based on the control signal S305$a$ from the CPU 305.

The CPU 305 generates the refresh number instruction signal S305$b$ based on the processing of the flow chart shown in FIG. 2 and outputs it to the refresh control signal generation circuit 306.

Then, the refresh control signal generation circuit 306 generates the refresh control signal S306 in accordance with the refresh number instruction signal S305$b$ and outputs it to the refresh control circuit 307.

The refresh control circuit 307 performs a refresh of the line buffer memory 303 based on the refresh control signal S306.

Figure 3:
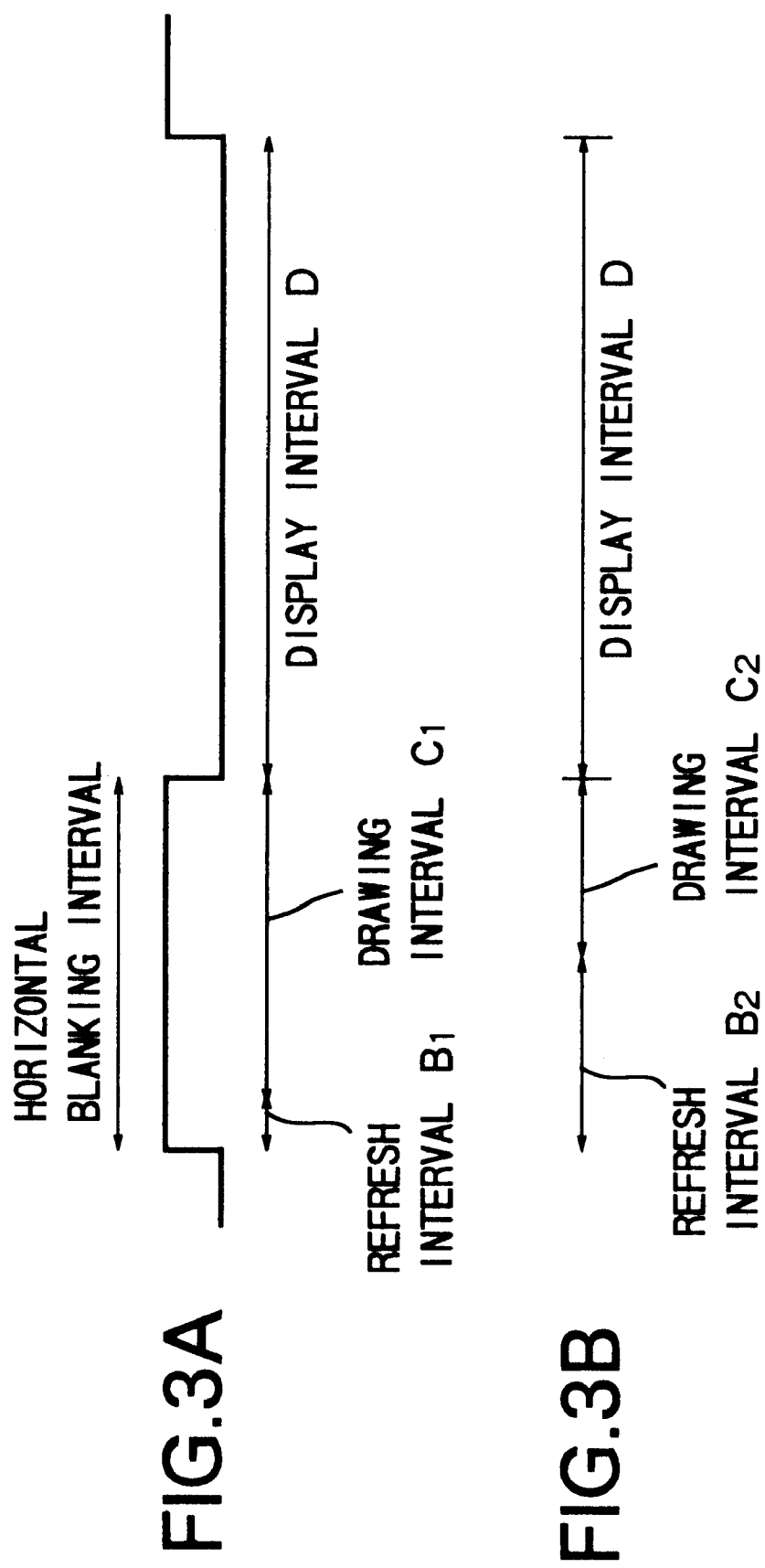
FIGS. 3A and 3B are views for explaining an example of a refresh of a DRAM in the image memory system shown in FIG. 1.

At this time, as shown in FIG. 2, the number of refreshes to performed within a horizontal blanking interval is determined based on the writing load to the line buffer memory 303. For example, when the writing load to the line buffer memory 303 is large, that is, a long drawing interval is required, the number of refreshes performed within the horizontal blanking interval is set smaller. As a result, as shown in FIG. 3A, the interval of the refresh $B_1$ becomes shorter and the interval of drawing $C_1$ becomes longer.

On the other hand, when the writing load to the line buffer memory 303 is small, that is, in a case where a short interval for drawing is acceptable, the number of refreshes to be performed within the horizontal blanking interval is set larger. As a result, as shown in FIG. 3B, the interval of the refresh $B_2$ becomes longer and the drawing interval $C_2$ becomes shorter.

As explained above, according to the image memory system 301, because the number of refreshes performed within each horizontal blanking interval is determined based on the writing load to the line buffer memory 303, when the writing load to the line buffer memory 303 becomes larger than a predetermined value, a longer drawing interval can be secured by reducing the number of refreshes to be performed within the horizontal blanking interval compared with the case of the related art where the refresh is performed at fixed time intervals (that is, a case where the number of refreshes performed within a horizontal blanking interval is fixed). As a result, it is possible to write all of the image signal S320 required in one horizontal interval to the line buffer memory 303 with a high probability, so the quality of the image displayed on the display 321 can be improved.

Also, according to the image memory system 301, the required number of refreshes is performed within a predetermined interval, therefore the storage state of the line buffer memory 303 can be maintained.

Furthermore, according to the image memory system 301, the load of the line buffer memory 303 can be dispersed over time.

As a result, the peak value of the power consumption in the image memory system 301 can be reduced so the amount of interconnections, circuit elements, etc. can be reduced and the storage device can be reduced in size.

Second Embodiment

In the above first embodiment, as shown in FIG. 1, a case of using a line buffer memory 303 of a single buffer system was shown as an example, but in the second embodiment, a case of using a line buffer memory of a dual buffer system will be explained.

Figure 4:
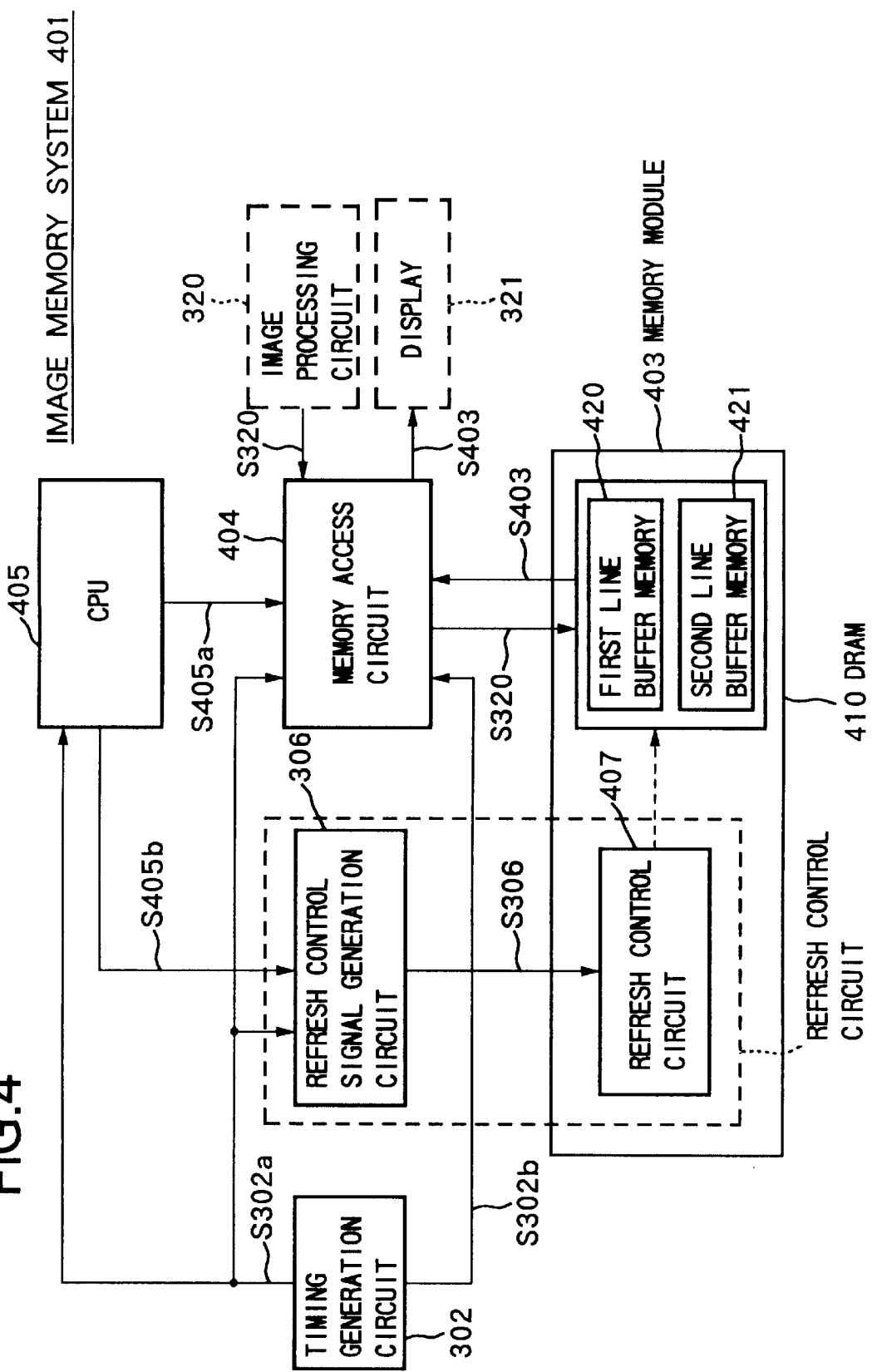
FIG. 4 is a view of the configuration of an image memory system according to a second embodiment of the present invention.

FIG. 4 is a view of the configuration of the image memory system 401 according to the second embodiment.

As shown in FIG. 4, the image memory system 401 comprises a timing generation circuit 302, a memory module 403, a memory access circuit 404, a CPU 405, a refresh control signal generation circuit 306, and a refresh control circuit 407.

In FIG. 4, components having the same reference numerals as those in FIG. 1 are the same as the components explained in the first embodiment.

Namely, the timing generation circuit 302 and the refresh control signal generation circuit 306 shown in FIG. 4 are the same as those explained in the first embodiment.

[Memory Module 403]

The memory module 403 is a line buffer memory of a dual buffer system and comprises a first line buffer memory 420 and a second line buffer memory 421 as shown in FIG. 4.

The first line buffer memory 420 and the second line buffer memory 421 respectively have a storage capacity capable of storing one line's worth of an image signal in one screen's worth of the image signal to be displayed on the display 321.

Here, the first line buffer memory 420 and the second line buffer memory 421 are accessible in parallel.

A refresh of the memory module 403 is performed simultaneously based on the control of the refresh control circuit 407.

[Memory Access Circuit 404]

The memory access circuit 404, based on a control signal S405a from the CPU 405, writes the image signal S320 input from the image processing circuit 320 to the first line buffer memory 420 and the second line buffer memory 421 of the memory module 403 in units of one line's worth of the image signal at timings based on the horizontal synchronizing signal S302a and the vertical synchronizing signal S302b from the timing generation circuit 302 and outputs the image signal S403 read from the first line buffer memory 420 and the second line buffer memory 421 to the display 321.

Here, the memory access circuit 404 can perform a write/read operation to/from the first line buffer memory 420 and a read/write operation from/to the second line buffer memory 421 in parallel.

Namely, while performing the write operation to the first line buffer memory 420, it is possible to perform a read operation from the second line buffer memory 421. Also, it is possible to perform a write operation to the second line buffer memory 421 while performing a read operation from the first line buffer memory 420.

Also, the memory access circuit 404 performs the read operation and the write operation alternately every other horizontal interval to the first line buffer memory 420 and the second line buffer memory 421.

[CPU 405]

The CPU 405 performs basically the same processing as the CPU 305 explained in the first embodiment shown in FIG. 2 except that it sends an access instruction to the memory module 403 after differentiating the first line buffer memory 420 and the second line buffer memory 421 based on the execution of the program.

[Refresh Control circuit 407]

The refresh control circuit 407 performs a refresh simultaneously to the first line buffer memory 420 and the second line buffer memory 421 based on the refresh number instruction signal S306.

Below, an example of the operation of the image memory system 401 shown in FIG. 4 will be explained by referring to FIGS. 5A and 5B.

First, the CPU 405, in response to the program being executed, determines the number of refreshes to be performed within the horizontal blanking interval $A_1$ based on the writing load to the first line buffer memory 420 by the memory access circuit 404 and outputs the refresh number instruction signal S405b indicating the determined number of refreshes to the refresh control signal generation circuit 306.

Then, the refresh control signal S306 in accordance with the refresh number instruction signal S405b is output from the refresh control signal generation circuit 306 to the refresh control circuit 407. Under the control by the refresh control circuit 407, the determined number of refreshes is performed within the horizontal blanking interval $A_1$ to the first line buffer memory 420 and the second buffer memory 421.

Figure 5:
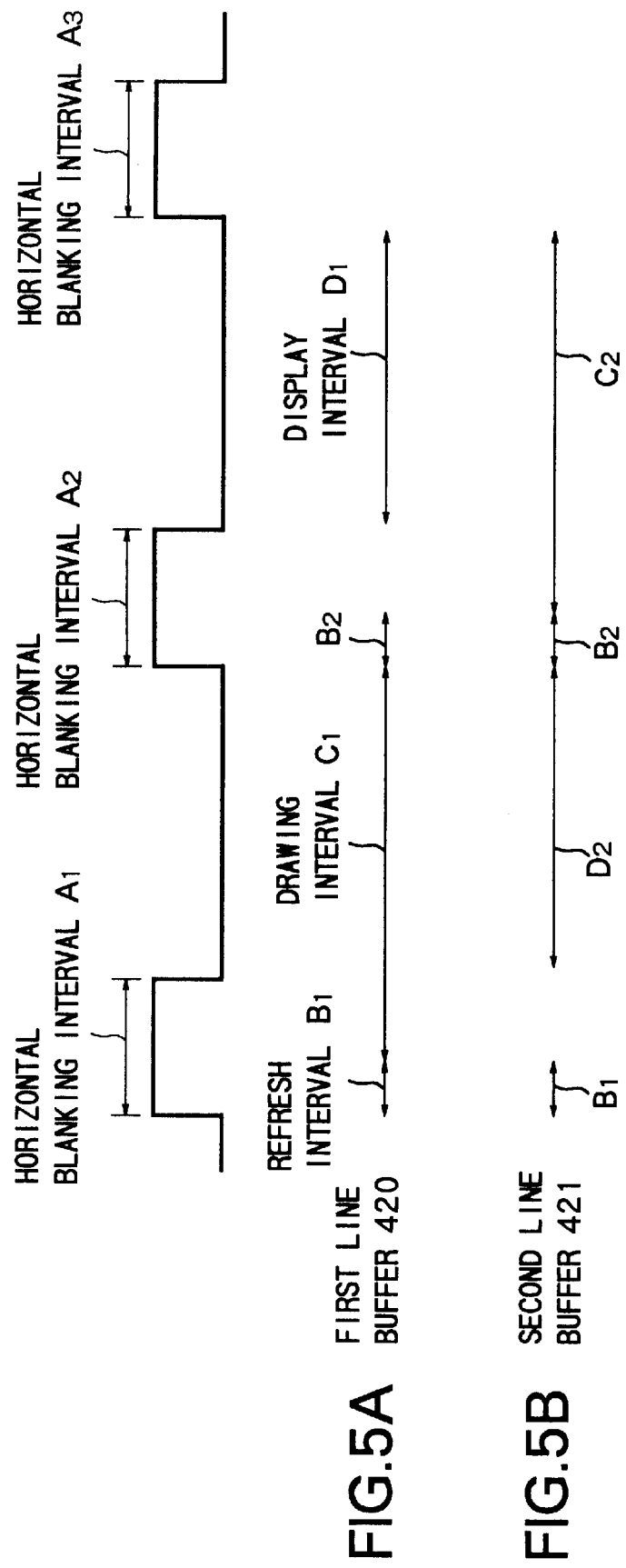
FIGS. 5A and 5B are views for explaining an example of a refresh of a DRAM in the image memory system shown in FIG. 4.

In this case, as shown in FIGS. 5A and 5B, the determined number of refreshes is performed to the first line buffer memory 420 and second line buffer memory 421 within the refresh interval $B_1$.

When the refresh interval $B_1$ ends, the image signal S320 from the image processing circuit 320 is written in the first line buffer memory 420 via the memory access circuit 404 based on the control signal S405a from the CPU 405 within the succeeding drawing interval $C_1$.

In parallel with this, in the displaying interval $D_2$ between the horizontal blanking intervals $A_1$ and $A_2$, the image signal S403 read from the second buffer memory 421 is output to the display 321 via the memory access circuit 404.

Next, the CPU 405, in response to the program being executed, determines the number of refreshes to be performed within the horizontal blanking interval $A_2$ based on the writing load to the second line buffer memory 421 by the memory access circuit 404 and outputs the refresh number instruction signal S405b indicating the determined number of refreshes to the refresh control signal generation circuit 306.

Then, the refresh control signal S306 in accordance with the refresh number instruction signal S405b is output from the refresh control signal generation circuit 306 to the refresh control circuit 407. Under the control by the refresh control circuit 407, the determined number of refreshes is performed to the first line buffer memory 420 and the second line buffer memory 421 within the horizontal blanking interval $A_2$.

In this case, as shown in FIGS. 5A and 5B, the determined number of refreshes is performed to the first line buffer memory 420 and the second line buffer memory 421 within the refresh interval $B_2$.

When the refresh interval $B_2$ ends, the image signal S320 from the image processing circuit 320 is written to the second line buffer memory 421 via the memory access circuit 404 based on the control signal S405a from the CPU 405 within the succeeding drawing interval $C_2$.

In parallel with this, in the displaying interval $D_1$ between the horizontal blanking intervals $A_2$ and $A_3$, the image signal S403 read from the first line buffer memory 420 is output to the display 321 via the memory access circuit 404.

The above processing is subsequently repeated.

Below, a case of using another line buffer memory of the dual buffer system will be explained.

In the above second embodiment, a case where the first line buffer memory 420 and the second line buffer memory 421 respectively have a storage capacity capable of storing one line's worth of an image signal in one screen's worth of the image signal to be displayed on the display 321 was explained as an example. Below, the explanation will be made of a case where the first line buffer memory 420 and the second line buffer memory 421 have a storage capacity capable of storing data of less than one line's worth of the image signal.

Figure 6:
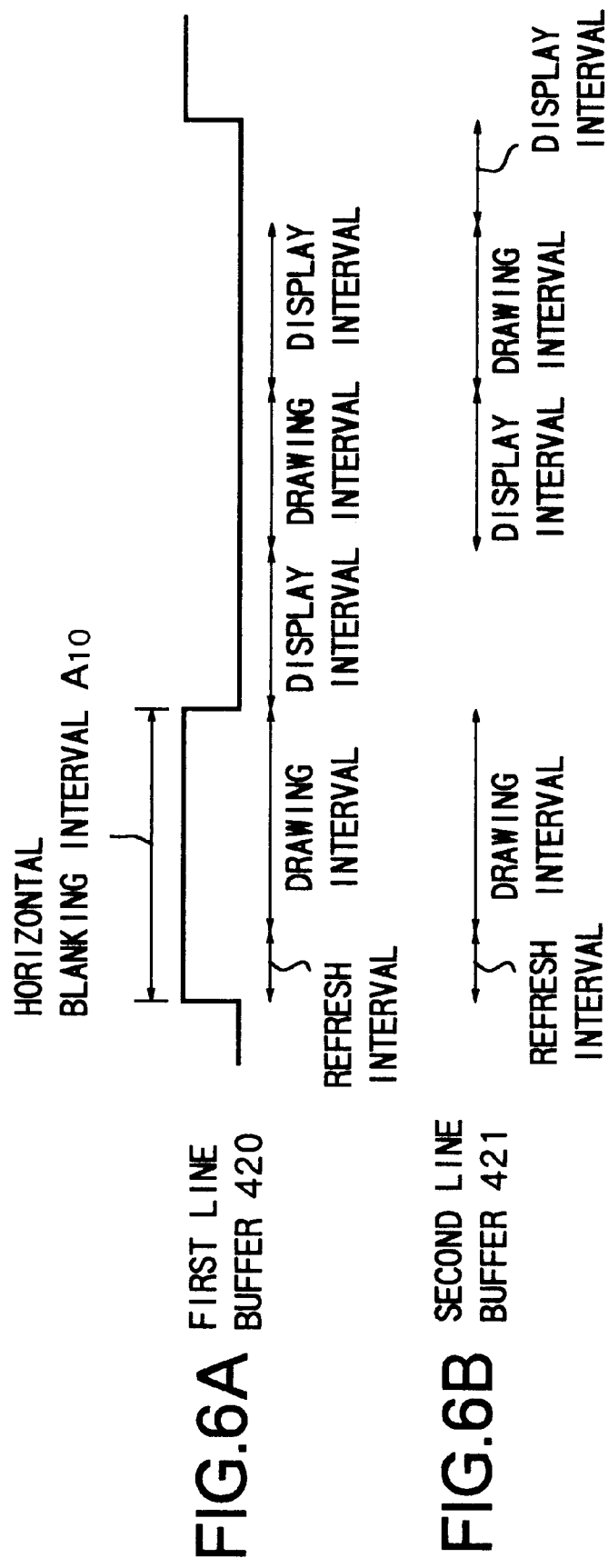
FIGS. 6A and 6B are views for explaining other examples of refreshes of a DRAM in the image memory system shown in FIG. 4.

In this case, as shown in FIG. 6, the display interval and the drawing interval are alternately set both in the first line buffer memory 420 and the second line buffer memory 421 during a time outside the duration of horizontal blanking interval.

By doing so, an image can be displayed on the display 321 without a break even when the storage capacities of the first line buffer memory 420 and the second line buffer memory 421 are less than the capacity for storing one line's worth of the image signal.

In this case also, the number of refreshes within each horizontal blanking interval is determined in the CPU 405 based on the writing load to the first line buffer memory 420 and second line buffer memory 421 by the memory access circuit 404.

Third Embodiment

In the third embodiment, a case of using a frame buffer memory as a memory module will be explained as an example.

Figure 7:
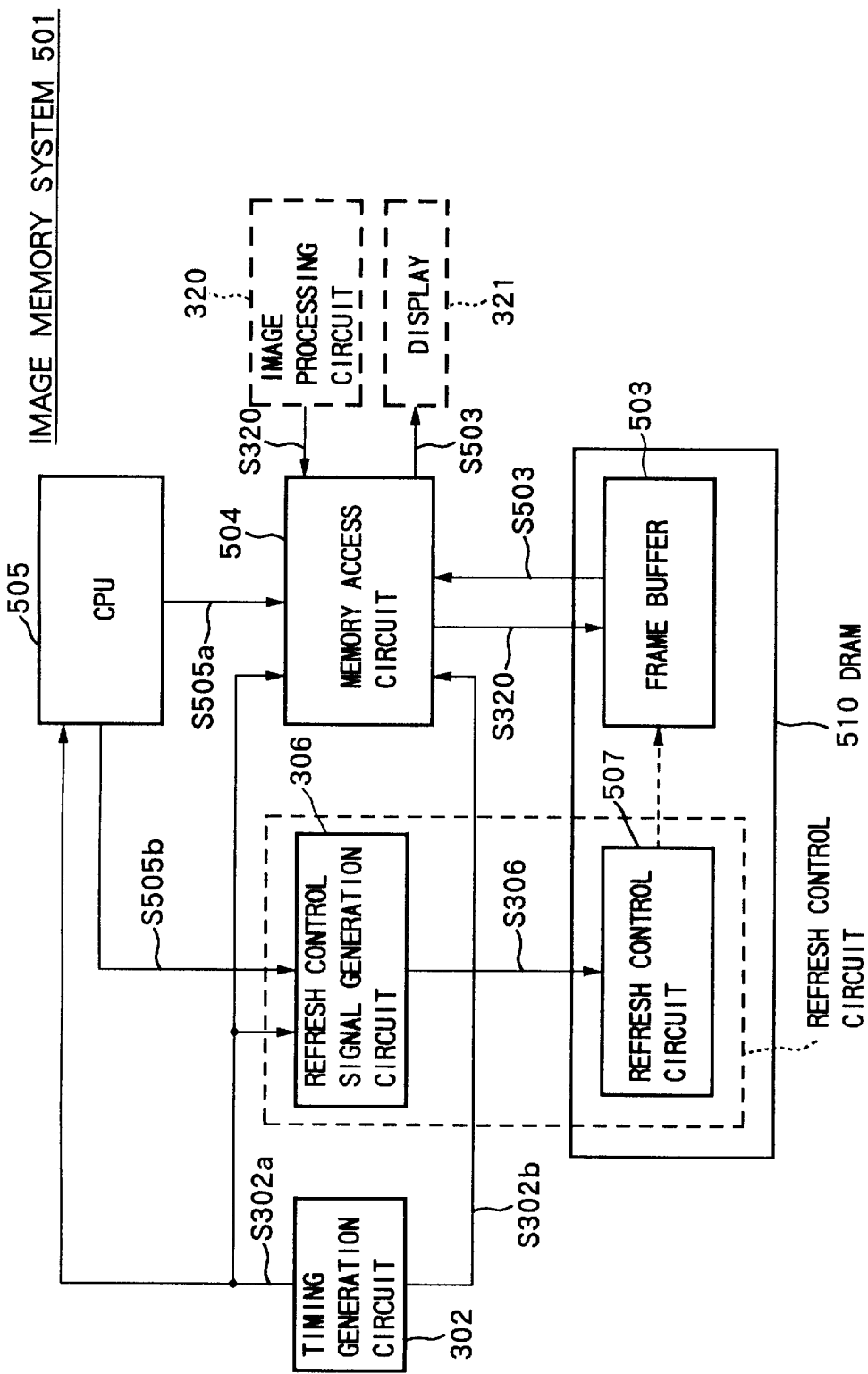
FIG. 7 is a view of the configuration of an image memory system according to a third embodiment of the present invention.

FIG. 7 is a view of the configuration of a image memory system 501 according to the third embodiment.

As shown in FIG. 7, the image memory system 501 comprises a timing generation circuit 302, a frame buffer memory 503, a memory access circuit 504, a CPU 505, a refresh control signal generation circuit 306, and a refresh control circuit 507.

In FIG. 7, components having the same reference numerals as those in FIG. 1 are the same as the components explained in the first embodiment.

Namely, the timing generation circuit 502 and the refresh control signal generation circuit 506 are the same as those explained in the first embodiment.

[Frame Buffer Memory 503]

The frame buffer memory 503 has a storage capacity capable of storing one screen's worth of an image signal to be displayed on the display 321. The storage capacity varies depending on the type of the display 321.

For example, if the display 321 is a one of the Video Electronics Standards Association (VESA) system —a standard of monitors of personal computers, the frame buffer memory 503 has a storage capacity capable of storing 1024 (lines) ×1280 (pixels) worth of an image signal corresponding to the actually displayed image on the display 321 and the image signal corresponding to a predetermined range of the image around the displayed image.

Note that the configuration of the frame buffer memory 503 may be, in the same way as the case of the explained line buffer memory, either the single buffer system comprised of a single frame buffer memory or the dual buffer system comprised of two frame buffer memories capable of being accessed simultaneously.

[Memory Access Circuit 504]

Figure 8:
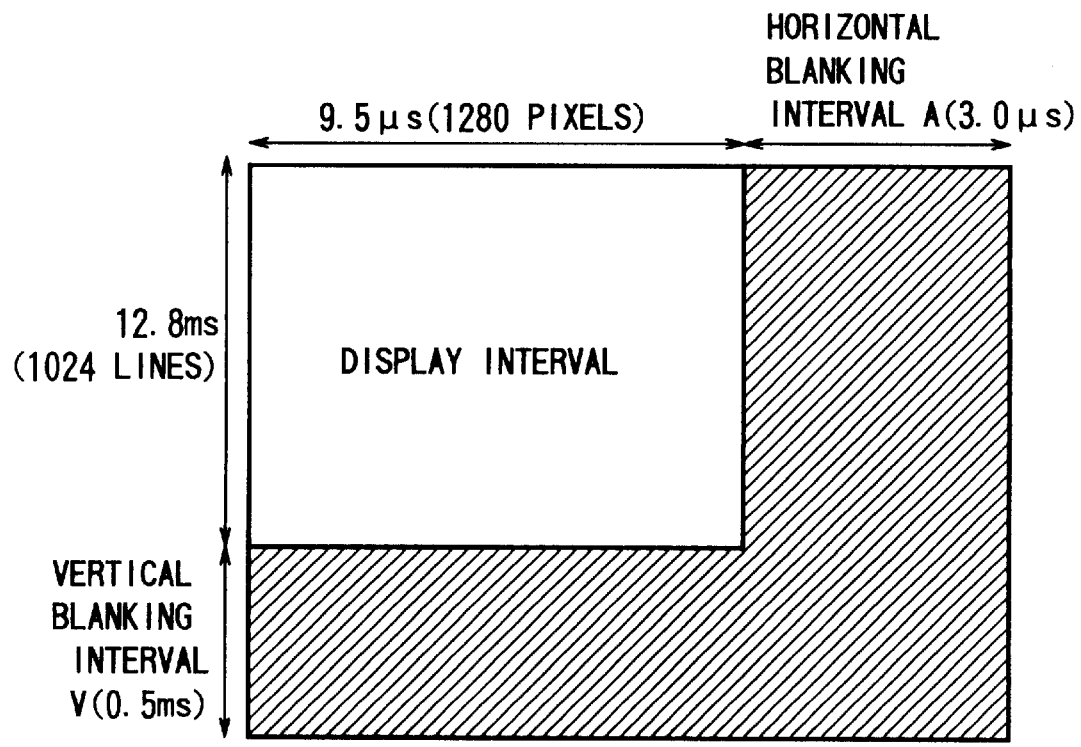
FIG. 8 is a view for explaining the timings of displaying the image signal read from the DRAM shown in FIG. 7.

Regarding the access to the frame buffer memory 503 by the memory access circuit 504, the writing interval (drawing interval) of the image signal S320 to the frame buffer memory 503 by the memory access circuit 504 is within the horizontal blanking interval A or the vertical blanking interval V shown in FIG. 8 of the image display on the display 321 when the frame buffer memory 503 is a single buffer memory system. On the other hand, the reading interval (display interval) of the image signal S503 from the frame buffer memory 503 by the memory access circuit 504 is outside the horizontal blanking interval A or the vertical blanking interval V of the image display on the display 321.

Here, when assuming a display 321 of the above VESA system, as shown in FIG. 8, 9.5 $\mu$s is required for displaying the image signal S503 for 1280 pixels comprising one line, and 12.8 ms is required for displaying the image signal S503 for 1024 lines.

In this case, for example, as a specification corresponding to the above step S3 shown in FIG. 2, when the frame buffer memory 503 is required to perform more than 512 refreshes within 8 msec, if on an average about 4($\approx$512/(1024×2/12.8)) refreshes are performed while writing one line's worth of the image signal S503 to the frame buffer memory 503.

Here, if the operating frequency of the refresh by the refresh control circuit 507 is 150 MHZ and one refresh takes 10 clock cycles, the refresh interval required for four refreshes becomes 0.26×10$^{-6}$ (4×10/(150×10$^{6}$))s, which is about 10% of the 3.0 $\mu$s of the horizontal blanking interval A.

In the third embodiment, the number of refreshes performed within each horizontal blanking interval A is set to be variable, for example, between 0 to 10 based on the writing (drawing) load to the frame memory buffer 503 from the memory access circuit 504 conditional on performing more than 512 refreshes within 8 msec.

When the frame buffer memory 503 is a dual buffer system, a write/read operation to/from the first line buffer memory and a read/write operation from/to the second line buffer memory can be performed in parallel.

Namely, it is possible to perform the read operation from the second line buffer memory while performing the write operation to the first line buffer memory. It is also possible to perform the write operation to the second line buffer memory while performing the read operation from the first line buffer memory.

At this time, the drawing operation is performed to the first frame buffer memory during the horizontal blanking interval, the vertical blanking interval, and the displaying interval of the second frame buffer memory. On the other hand, the drawing operation is performed to the second frame buffer memory during the horizontal blanking interval, the vertical blanking interval, and the displaying interval of the first frame buffer memory.

[CPU 505]

The processing for generation of the refresh number instruction signal S505$b$ in the CPU 505 is basically the same as the above explained processing of the CPU 305 shown in FIG. 1 when the frame buffer memory 503 is a single buffer system and is basically the same as the processing of the CPU 405 shown in FIG. 4 when it is a dual buffer system.

[Refresh Control Circuit 507]

The refresh of the frame buffer memory 503 by the refresh control circuit 507 is basically the same as the processing of the refresh control circuit 307 shown in FIG. 1 when the frame buffer memory 503 is a single buffer system and is basically the same as the processing of the above refresh control circuit 407 shown in FIG. 4 when the frame buffer memory 503 is a dual buffer system.

In the image memory system 501, drawing can be carried out with relative leeway since the frame buffer memory 503 is used for it. However, since the drawing timings tend to concentrate together, the CPU 505 reduces the number of refreshes within a horizontal blanking interval when the drawing timings are concentrated and increases them when almost no drawing is carried out.

As a result, according to the image memory system 501, it is possible to write all of the necessary image signal S320 to the frame buffer memory 503 within one horizontal interval with a high probability, so the quality of the image displayed on the display 321 can be improved.

Also, according to the image memory system 501, since a necessary number of refreshes is carried out within a predetermined interval, the state of storage condition of the frame buffer memory 503 can be maintained.

Further, according to the image memory system 501, the load to the frame buffer memory 503 can be dispersed over time. As a result, the peak power consumption in the image memory system 501 can be reduced and the amount of interconnections, circuit elements, etc. can be reduced, so it is possible to reduce the size.

Fourth Embodiment

Below, in the present embodiment, a case will be explained where the storage device of the present invention is applied to a three-dimensional computer graphic system which displays a desired three-dimensional image of any three-dimensional object model on a display such as a CRT.

FIG. 9 is a view of the system configuration of the three-dimensional computer graphic system 1 of the present embodiment.

The three-dimensional computer graphic system 1 is for performing polygon rendering wherein a three-dimensional model is expressed as a composite of triangular graphics (polygon) and the colors of the pixels on the display screen are decided by drawing the polygons.

Also, in the three-dimensional computer graphic system 1, in addition to the coordinates (x, y) indicating a position on a plane, a z-coordinate indicating a depth is used for expressing a three-dimensional object. The three coordinates (x, y, z) can specify any point in the three-dimensional space.

As shown in FIG. 9, the three-dimensional computer graphic system 1 comprises a main memory 2, an I/O interface circuit 3, a main processor 4, and a rendering circuit 5 via a main bus 6.

Here, the main processor 4 corresponds to the refresh number decision circuit of the present invention.

Also, the three-dimensional computer graphic system 1 comprises a timing generation circuit 7 for generating a horizontal synchronizing signal S6a and a vertical synchronizing signal S6b.

Below, the functions of the respective components will be explained.

[Main Processor 4]

The main processor 4 generates, for example, a control signal for controlling the components in the rendering circuit 5 in accordance with execution of a program and outputs the control signal to the rendering circuit 5 via a main bus 6.

Also, the main processor 4 performs processing in accordance with the flow chart shown in FIG. 2 explained in the above first embodiment and judges the writing load to the buffer memories 20 to 23 of the DRAM 16 based on the program being executed for every horizontal blanking interval.

Here, the writing load is determined, for example, in accordance with the number of polygons, number of pixels, the existence of a blending, etc.

The main processor 4 determines the number of refreshes to be carried out in the horizontal blanking interval and outputs a refresh number instruction signal S4b indicating the determined number to a memory I/F circuit 13 of the rendering circuit 5 via the main bus 6.

Also, when executing a predetermined instruction in a program, the main processor 4 reads the necessary graphic data from the main memory 2 and performs clipping, lighting, geometry processing, etc. on the graphic data to generate polygon rendering data. The main processor 4 outputs the polygon rendering data S4a to the rendering circuit 5 via the main bus 6.

Here, the polygon rendering data includes data of the three vertexes (x, y, z, R, G, B, α, s, t, q, F) of the polygon.

Here, the (x, y, z) data indicates the three-dimensional coordinates of a vertex of the polygon, and the (R, G, B) data indicates the luminance values of red, green, and blue at the three-dimensional coordinates, respectively.

The data α indicates a coefficient of blending the R, G, B data of a pixel to be drawn and that of a pixel already stored in the display buffer memory 21.

Among the (s, t, q) data, (s, t) indicates homogeneous coordinates of a corresponding texture and q indicates the same ordinate term. Here, the texture sizes USIZE and VSIZE are respectively multiplied with "s/q" and "t/q" to obtain coordinate data (u, v) of the texture. The texture coordinate data (u, v) is used for accessing the texture data stored in the texture buffer memory 20.

Here, the texture data indicates a surface pattern of the object to be displayed as a three-dimensional graphic.

The F data indicates an α value of fogging.

Namely, the polygon rendering data indicates physical coordinate values of the vertexes of a triangle (unit graphic) and values of colors of the vertexes, texture, and fogging.

[I/O Interface Circuit 3]

The I/O interface circuit 3 receives as input polygon rendering data from outside in accordance with needs and outputs the same to the rendering circuit 5 via the main bus 6.

[Rendering Circuit 5]

Below, the rendering circuit 5 will be explained in detail.

As shown in FIG. 9, the rendering circuit 5 comprises a digital differential analyzer (DDA) set up circuit 10, a triangle DDA circuit 11, a texture engine circuit 12, a memory I/F circuit 13, a CRT controller circuit 14, a DAC circuit 15, a DRAM 16, and an SRAM 17, all of which operate based on a control signal from the main processor 4.

The DRAM 16 functions as a texture buffer memory 20, a display buffer memory 21, a z-buffer memory 22, and a texture CLUT buffer memory 23. For example, as a display buffer memory 21, a frame buffer memory is used.

Here, the texture engine circuit 15 corresponds to the image processing circuit of the present invention, the buffer memories 20 to 23 correspond to the semiconductor memory of the present intention, the memory I/F circuit 13 corresponds to the memory access circuit of the present invention, and a part of the functions of the memory I/F circuit 13 corresponds to the refresh control circuit of the present invention.

[DDA Set-Up Circuit 10]

The DDA set-up circuit 10, prior to obtaining information of the color and depth of the respective pixels inside the triangle by performing linear interpolation on the values of the vertexes of the triangle on the physical coordinates in a triangle DDA circuit 11 in its latter part, performs a set-up operation for obtaining the difference of a side of the triangle from a horizontal direction for the data (z, R, G, B, α, s, t, q, F) indicated by the polygon rendering data S4a.

Specifically, this set-up operation uses values of the starting point and the ending point and the distance between the two points to calculate the variation of the value to find movement for a unit length.

The DDA set-up circuit 10 outputs the calculated difference as the difference data S10 to the triangle DDA circuit 11.

[Triangle DDA Circuit 11]

The triangle DDA circuit 11 uses the difference data S10 input from the DDA set-up circuit 10 to calculate the (z, R, G, B, α, s, t, q, F) data after linear interpolation of each pixel inside the triangle.

The triangle DDA circuit 11 outputs the data (x, y) for each pixel and the (z, R, G, B, α, s, t, q, F) data at the (x, y) coordinates to the texture engine circuit 12 as DDA data (interpolation data) S11.

In the present embodiment, the triangle DDA circuit 11 outputs the DDA data S11 of 8 (=2×4) pixels positioned inside a block being processed in parallel to the texture engine circuit 12.

[Texture Engine Circuit 12]

The texture engine circuit 12 performs the calculation of "s/q" and "t/q", calculation of the texture coordinate data (u, v), reading of the data (R, G, B, α) from the texture buffer memory 20, and α blending successively in a pipeline format.

Note that the texture engine circuit 12 performs the processing on the 8 pixels positioned inside a predetermined block simultaneously in parallel.

The texture engine circuit 12 performs the operation for dividing the data s by the data q and the operation for dividing the data t by the data q to the data (s, t, q) indicated by the DDA data S11.

Also, the texture engine circuit 12 respectively multiplies the texture sizes USIZE and VSIZE with the division results "s/q" and "t/q" to generate the texture coordinate data (u, v).

The texture engine circuit 12 outputs a reading request including the generated texture coordinate data (u, v) to the SRAM 17 via the memory I/F circuit 13. The texture engine circuit 12 obtains the data S17 (R, G, B, $\alpha$) stored at the texture address specified by the data (u, v) by reading the texture data stored in the SRAM 17 via the memory I/F circuit 13.

Here, the MIPMAP (texture of a plurality of resolutions) and other texture data corresponding to a plurality of reducing rates is stored in the texture buffer memory 20, and a copy of the texture data stored in the texture buffer memory 20 is stored in the SRAM 17.

In the present embodiment, by generating the texture coordinates (u, v) in the above way, the texture data of a desired reducing rate can be read from the SRAM 17 in units of triangles, that is, unit graphics.

The texture engine circuit 12 generates pixel data S12 by blending the (R, G, B) data in the data S17 (R, G, B, $\alpha$) read from the SRAM 17 and the (R, G, B) data included in the DDA data S11 from the triangle DDA circuit 11 in the former stage by the ratio indicated by the $\alpha$ data (texture $\alpha$) included in the data S17 (R, G, B, $\alpha$).

The texture engine circuit 12 outputs the pixel data S12 to the memory I/F circuit 13.

In the case of a full color mode, the texture engine circuit 12 directly uses the data (R, G, B, $\alpha$) read from the texture buffer memory 20. In the case of an index color mode, the texture engine circuit 12 reads a color look-up table (CLUT), prepared in advance, from the texture CLUT buffer memory 23, transfers and stores the same in the built-in SRAM, and uses the color look-up table to obtain the data (R, G, B) corresponding to the color index read from the texture buffer memory 20.

[Memory I/F Circuit 13]

The memory I/F circuit 13, at the time of displaying on the CRT 31, outputs display data (image data) S21 read from the display buffer memory 21 to the CRT controller circuit 14.

Also, the memory I/F circuit 13 compares the z-data corresponding to the pixel data S12 input from the texture engine circuit 12 with the z-data stored in the z-buffer memory 22 and judges whether the image drawn by the input pixel data S12 is positioned closer to the viewing point than the image written in the display buffer memory 21 the previous time. When it is judged that the image drawn by the input pixel data S12 is positioned closer, the memory I/F circuit 13 updates the z-data stored in the buffer memory 22 by the z-data corresponding to the pixel data S12.

Also, the memory I/F circuit 13, in accordance with need, blends the (R, G, B) data included in the pixel data S12 and the (R, G, B) data already stored in the display buffer memory 21 by the blending ratio indicated by the $\alpha$ data corresponding to the pixel data S12, that is, $\alpha$ blending. Then, the memory I/F circuit 13 writes the data (R G, B) after blending to the display buffer memory 21 as display data.

Note that the DRAM 16 is simultaneously accessed by the memory I/F circuit 13 for 16 pixels's worth of data.

Also, the memory I/F circuit 13 outputs to a refresh control circuit 30 a refresh control signal S13a for controlling the number of refreshes to be performed for the number indicated by the refresh number instruction signal S13a input from the main processor 4 during the horizontal blanking interval determined based on the horizontal synchronizing signal S6a.

At this time, the memory I/F circuit 13 stores information to specify the line where a refresh is completed from among the buffer memories 0 to 23. Then, at the next refresh, the memory I/F circuit 13, based on the stored line, generates a refresh control signal S13a specifying a line to which the next refresh is performed.

[CRT Controller Circuit 14]

The CRT controller circuit 14 generates an address for display on a not illustrated CRT in synchronization with the horizontal synchronizing signal S6a and the vertical synchronizing signal S6b input from the timing generation circuit 7 and outputs a request for reading the display data stored at the address from the display buffer memory 21 to the memory I/F circuit 13. In accordance with the request, the memory I/F circuit 13 reads the display data as a certain block from the display buffer memory 21.

The CRT controller circuit 14 is provided with a built-in first-in first-out (FIFO) circuit for storing the display data read from the display buffer memory 21, reads the stored display data at fixed time intervals, and outputs the display data S14a to the DAC circuit 15.

[DRAM 16]

The DRAM 16 comprises a texture buffer memory 20, a display buffer memory 21, a z-buffer memory 22, a texture CLUT buffer memory 23, and a refresh control circuit 30.

Here, the texture buffer memory 20 stores the MIPMAP (textures of a plurality of resolutions) or other texture data corresponding to a plurality of reducing rates as explained above.

The display buffer memory 21 is, for example, a frame buffer memory for storing display data indicating the R, G, B values of each pixel.

Note that the display buffer memory 21 may be either of a single buffer system or a dual buffer system.

The z-buffer memory 22 stores the z-data of each pixel.

The texture CLUT buffer memory 23 stores a color lookup table (CLUT).

The refresh control circuit 30, based on the refresh control signal S13a from the memory I/F circuit 13, performs a refresh on the texture buffer memory 20, the display buffer memory 21, the z-buffer memory 22, and the texture CLUT buffer memory 23.

[DAC Circuit 15]

The DAC circuit 15 stores the R, G, B data corresponding to each index value, transfers the display data S14a input from the CRT controller circuit 14 to the D/A converter, and generates R, G, B data in an analog mode. The DAC circuit 15 outputs the generated R, G, B data S15 to the CRT 31.

Below, the operation of the three-dimensional computer graphic system 1 will be explained.

Polygon rendering data S4a is output from the main processor 4 to the DDA set-up circuit 10 via the main bus 6, and difference data S10 indicating the difference of a triangle side from the horizontal direction is generated at the DDA set-up circuit 10.

The difference data S10 is output to the triangle DDA circuit 11. The triangle DDA circuit 11 calculates data (z, R, G, B, $\alpha$, s, t, q, F) after linear interpolation for each pixel inside the triangle. Then the obtained data (z, R, G, B, $\alpha$, s, t, q, F) and the (x, y) data of the vertexes of the triangle are output as DDA data S11 from the triangle DDA circuit 11 to the texture engine circuit 12.

Next, the texture engine circuit 12 performs the operation for dividing the data s by the data 9 and the operation for dividing the data t by the data q on the (s, t, q) data indicated by the DDA data S11.

Then, the texture coordinate data (u, v) is generated by respectively multiplying the texture sizes USIZE and VSIZE with the division results "s/q" and "t/q".

Next, a reading request including the generated texture coordinates data (u, v) is output from the texture engine circuit 12 to the SRAM 17 via the memory I/F circuit 13 and the (R, G, B, α) data S17, that is, texture data stored in the SRAM 17, is read via the memory I/F circuit 13.

Next, the texture engine circuit 12 generates the pixel data S12 by blending the (R, G, B) data of the read (R, G, B, α) data S17 and the (R, G, B) data included in the DDA data S11 from the triangle DDA circuit 11 in the former stage by the ratio indicated in the α data (texture α) included in the (R, G, B, α) data S17.

The pixel data S12 is output to the memory I/F circuit 13 from the texture engine circuit 12.

Then the memory I/F circuit 13 compares the z-data corresponding to the pixel data S12 input from the texture engine circuit 12 with the z-data stored in the z-buffer memory 22, judges whether the image drawn by the input pixel data S12 is positioned closer to the viewing point than the image drawn in the display buffer memory 21 previous time, and, when the image drawn by the input pixel data S12 is judged to be positioned closer to the viewing point, the z-data stored in the z-buffer memory 22 is updated by the z-data corresponding to the image data S12.

The memory I/F circuit 13, in accordance with need, blends the (R, G, B) data included in the image data S12 and the (R, G, B) data already stored in the display buffer memory 21 by the ratio indicated by the α data corresponding to the pixel data S12. Then the blended data (R, G, B) is written to the display buffer memory 21 as display data.

Then, the (R, G, B) data stored in the display buffer memory 21 by the memory I/F circuit 13 is read during the display time outside the horizontal blanking interval and the vertical blanking interval and output to the CRT controller circuit 14 as the display data S21.

Then, the display data S21 is adjusted in timing in the CRT controller circuit 14, then is output to the DAC circuit 15 as display data S14a.

The display data S14a is converted to the R, G, B data S15 in the DAC circuit 15 and output to the CRT 31.

Also, in the three-dimensional computer graphic system 1, a refresh of the DRAM 16, explained below, is performed in parallel with the above processing.

Namely, the main processor 4, as explained above, monitors the writing load to the buffer memories 20 to 23 of the DRAM 16 based on a program being executed for each horizontal blanking interval and determines the number of refreshes to be performed during the horizontal blanking interval based on the results of monitoring.

Then, the refresh number instruction signal S4b indicating the determined number is output to the memory I/F circuit 13 of the rendering circuit 5 via the main bus 6.

Then, the memory I/F circuit 13 generates the refresh control signal S13a for control so that a number of refreshes indicated by the refresh number instruction signal S4b is performed within the horizontal blanking interval determined based on the horizontal synchronizing signal S6a and outputs the refresh control signal S13a to the refresh control circuit 30.

Then, the refresh control circuit 30, based on the refresh control signal S13a from the memory I/F circuit 13, performs a refresh on the texture buffer memory 20, the display buffer memory 21, the z-buffer memory 22, and the texture CLUT buffer memory 23.

As explained above, according to the three-dimensional computer graphic system 1, the writing load to the DRAM 16 is monitored by the main processor 4 and the number of refreshes is determined for each horizontal blanking interval based on the monitoring results.

As a result, it is possible to write all of the necessary display data within one horizontal interval to the display buffer memory 21 at a high probability, so the quality of the image displayed on the CRT 31 can be improved.

Also, according to the three-dimensional computer graphic system 1, since the necessary number of refreshes can be performed within the predetermined time, the state of storage of the DRAM 16 can be maintained.

Further, according to the three-dimensional computer graphic system 1, it is possible to disperse the load on the DRAM 16 over time.

As a result, the peak value of the power consumption of the DRAM 16 can be lowered, the amount of interconnections, circuit elements, etc. can be reduced, and the size can be reduced.

While the invention has been described with reference to specific embodiment chosen for purpose of illustration, it should be apparent that numerous modifications could be made thereto by those skilled in the art without departing from the basic concept and scope of the invention.

For example, a DRAM was shown as an example of the semiconductor memory in the above embodiment, but the present invention can be similarly applied to other semiconductor memories which need a refresh for retaining the memory.

Also, in the above embodiments, a case of storing an image signal in the semiconductor memory was shown as an example, however, the present invention can also be applied to the case of storing other signals in the semiconductor memory.

Also, in the above embodiments, a case of generating a refresh number instruction signal S4b in the main processor 4 provided outside the rendering circuit 5 was shown as an example, however, the refresh number instruction signal may be generated inside the rendering circuit 5 by adding a function of judging the writing load to the buffer memories 20 to 23 to the memory I/F circuit 13 or CRT controller circuit.

Also, in the above embodiments, the case of application of the storage device of the present invention to a three-dimensional computer graphics system was illustrated, but the present invention can also be applied to a two-dimensional computer graphic system.

Further, in the three-dimensional computer graphic system 1 shown in FIG. 9, a configuration using the SRAM 17 was illustrated, but it may also be configured without providing the SRAM 17.

Further, the texture buffer memory 20 and texture CLUT buffer memory 23 shown in FIG. 9 may also be provided outside the DRAM 16.

Further, in the three-dimensional computer graphic system shown in FIG. 9, the case of performing geometry processing for generating polygon rendering data by the main processor 4 was illustrated, but this may also be performed by the rendering circuit 5.

Summarizing the effects of the invention again, according to the storage device, image processing apparatus and method of the same, and refresh controller and method of the same of the present invention, it is possible to improve the performance in accessing a semiconductor memory while suitably retaining stored data of the semiconductor memory by a refresh.

Further, according to the storage device, image processing apparatus, and refresh controller of the present invention, it is possible to lighten the load of the semiconductor memory along with a refresh and help reduce the size of the semiconductor memory.

What is claimed is:

1. A storage-device comprising:
   at least one semiconductor memory which requires a refresh to retain memory;
   a memory access circuit for accessing said at least one semiconductor memory;
   a refresh operation control circuit for controlling said at least one semiconductor memory so that an instructed number of refreshes are performed in a predetermined period; and
   a refresh number determining circuit for monitoring the an access load of said memory access circuit with respect to said semiconductor memory, determining the number of refreshes performed in the predetermined period on the basis of the access load, and instructing the determined number of refreshes to said refresh operation control circuit.

2. A storage device as set forth in claim 1, wherein:
   said at least one semiconductor memory stores an image signal;
   said memory access circuit writes the image signal to said semiconductor memory in a blanking interval at the time of displaying an image according to the image signal read from said at least one semiconductor memory; and
   said refresh number determining circuit monitors a writing load of said image signal by said memory access circuit.

3. A storage device as set forth in claim 1, wherein said memory access circuit reads the image signal from said at least one semiconductor memory outside the blanking interval.

4. A storage device as set forth in claim 1, wherein said refresh number determining circuit determines the number of refreshes to be performed in the predetermined period to be smaller along with an increase of the access load.

5. A storage device as set forth in claim 1, wherein said refresh number determining circuit executes a predetermined program, controls said memory access circuit on the basis of a result of execution of the program, and determines the access load on the basis of the program.

6. A storage device as set forth in claim 2, wherein:
   said at least one semiconductor memory comprises at least a first semiconductor memory and a second semiconductor memory capable of being accessed simultaneously; and
   said memory access circuit writes an image signal in said first semiconductor memory in a first blanking interval and a first display interval for reading image data from said second semiconductor memory following the first blanking interval and writes an image signal to said second semiconductor memory in a second blanking interval and a second display interval for reading image data from said first semiconductor memory following the second blanking interval.

7. A storage device as set forth in claim 2, wherein said at least one semiconductor memory is a line buffer memory.

8. A storage device as set forth in claim 2, wherein said at least one semiconductor memory is a frame buffer memory.

9. A storage device as set forth in claim 2, wherein the blanking interval is a horizontal blanking interval.

10. A storage device as set forth in claim 2, wherein said at least one semiconductor memory is a dynamic random access memory (DRAM).

11. A refresh controller for controlling a refresh of a semiconductor memory which requires a refresh to retain memory, comprising:
    a refresh control circuit for control so that said semiconductor memory performs an instructed number of refreshes in a predetermined period; and
    a refresh number determining circuit for monitoring an access load with respect to said semiconductor memory, determining the number of refreshes to be performed in the predetermined period on the basis of the access load, and instructing the determined number to said refresh control circuit.

12. A refresh controller as set forth in claim 11, wherein
    when an image signal is stored in said semiconductor memory and image data is written in said semiconductor memory in a blanking interval at a time of displaying an image in accordance with the image signal read from said semiconductor memory,
    said refresh number determining circuit monitors a writing load of the image signal with respect to said semiconductor memory.

13. An image processing apparatus comprising:
    an image processing circuit performing image processing to produce image data;
    a semiconductor memory storing the image data and requiring a refresh to retain the memory;
    a memory access circuit for writing the produced image data in a blanking interval at a time of displaying an image in accordance with image data read from said semiconductor memory;
    a refresh control circuit for control so that said semiconductor memory performs an instructed number of refreshes in a predetermined period;
    a refresh number determining circuit for monitoring an access load of said memory access circuit with respect to said semiconductor memory, determining the number of refreshes performed in the predetermined period on the basis of the access load, and instructing the determined number to said refresh control circuit.

14. An image processing apparatus as set forth in claim 13, wherein:
    said memory access circuit reads image data from said semiconductor memory and outputs the image data to display means outside of the blanking interval.

15. An image processing apparatus as set forth in claim 13, wherein said refresh number determining circuit executes a predetermined program and controls said memory access circuit and said image processing circuit on the basis of result of execution of the program.

16. An image processing apparatus as set forth in claim 13, wherein
    when a three-dimensional model is expressed by a composite of unit graphics to which common processing conditions are applied, texture data indicating a pattern to be displayed in the unit graphics is set in correspondence with the unit graphics, and an image in accordance with the correspondence is displayed,
    said semiconductor memory stores the texture data and the image data,
    said memory access circuit outputs the texture data read from said semiconductor memory to said image processing circuit, and said image processing circuit generates the image data by a correspondence between the unit graphics and the texture data.

17. An image processing apparatus as set forth in claim 16, wherein said semiconductor memory stores a plurality of texture data corresponding to different reducing rates.

18. An image processing apparatus as set forth in claim 17, further comprising:

a unit graphic rendering data generating means for generating unit graphic rendering data including three-dimensional coordinates (x, y, z), R (red), G (green), B (blue) data, homogeneous coordinates (s, t), and a homogeneous term q for vertexes of the unit graphics; and an interpolation data generating means for interpolating unit graphic rendering data to generate image data of pixels located inside the unit graphics, wherein said memory access circuit reads texture data corresponding to a desired reducing rate from an address of said semiconductor memory specified by homogeneous coordinates (s, t) and the homogeneous term q included in the image data; and said image processing circuit produces the image data on the basis of the produced image data and the read texture data.

19. A refresh control method for controlling a refresh of a semiconductor memory which requires a refresh to retain memory, comprising the steps of:

monitoring an access load to said semiconductor memory and determining a number of refreshes to be performed in a predetermined period on the basis of the access load; and controlling the refresh so that said semiconductor memory performs the determined number of refreshes in the predetermined period.

20. A refresh control method as set forth in claim 19, further comprising:

when an image signal is stored in said semiconductor memory and image data is written in said semiconductor memory in a blanking interval at a time of displaying an image in accordance with the image signal read from said semiconductor memory, monitoring a writing load of the image signal with respect to said semiconductor memory and determining the number of refreshes to be performed in the predetermined period on the basis of the writing load.

21. An image processing method comprising the steps of:

performing image processing to produce an image signal, writing the produced image signal in a blanking interval at a time of displaying an image in accordance with an image signal read from a semiconductor memory which requires a refresh to retain memory;

monitoring a writing load of the image signal with respect to said semiconductor memory and performing a number of refreshes to be performed in a predetermined period on the basis of the writing load; and controlling so that said semiconductor memory performs the number of refreshes in the predetermined period.

22. An image processing method as set forth in claim 21, further comprising the steps of:

reading the image signal from said semiconductor memory and outputting the image signal to display means outside the blanking interval.

* * * * *

UNITED STATES PATENT AND TRADEMARK OFFICE
CERTIFICATE OF CORRECTION

PATENT NO.   : 6,313,844 B1
DATED        : November 6, 2001
INVENTOR(S)  : Yujiro Yamashita It is certified that error appears in the above-identified patent and that said Letters Patent is hereby corrected as shown below:

Column 19,
Line 17, remove "an"

Signed and Sealed this

Fourth Day of February, 2003

JAMES E. ROGAN
*Director of the United States Patent and Trademark Office*